United States Patent
Kobayashi et al.

(10) Patent No.: US 6,787,241 B2
(45) Date of Patent: Sep. 7, 2004

(54) FILM OBTAINED FROM SILSESQUIOXANE POLYMER AND METHOD OF PREPARING SAME

(75) Inventors: Toshiaki Kobayashi, Ushiku (JP); Teruyuki Hayashi, Matsudo (JP); Masato Tanaka, Tokyo (JP); Kouichi Yamaguchi, Otsu (JP)

(73) Assignee: National Institute of Advanced Industrial Science and Technology (JP)

( * ) Notice: Subject to any disclaimer, the term of this patent is extended or adjusted under 35 U.S.C. 154(b) by 0 days.

(21) Appl. No.: 10/096,667

(22) Filed: Mar. 14, 2002

(65) Prior Publication Data

US 2003/0054180 A1 Mar. 20, 2003

(30) Foreign Application Priority Data

Mar. 27, 2001 (JP) ...................................... 2001-091233

(51) Int. Cl.$^7$ ............................ B32B 25/20; B05D 3/02
(52) U.S. Cl. ...................... 428/447; 427/387; 525/478; 525/479; 528/25; 528/31; 528/32
(58) Field of Search ........................ 428/447; 427/387; 525/478, 479; 528/25, 31, 32

(56) References Cited

U.S. PATENT DOCUMENTS

| | | | | |
|---|---|---|---|---|
| 4,847,162 A | * | 7/1989 | Haluska et al. | 428/457 |
| 5,336,532 A | * | 8/1994 | Haluska et al. | 427/515 |
| 5,506,177 A | * | 4/1996 | Kishimoto et al. | 438/624 |
| 5,899,751 A | * | 5/1999 | Chang et al. | 438/758 |
| 5,942,638 A |   | 8/1999 | Lichtenhan et al. | 556/460 |
| 6,143,360 A | * | 11/2000 | Zhong | 427/244 |
| 6,175,031 B1 | * | 1/2001 | Tachikawa | 556/479 |
| 6,410,772 B2 | * | 6/2002 | Okuyama et al. | 556/479 |

OTHER PUBLICATIONS

English Translation of JP 09–296044, Kobayashi et al, Nov. 1997, from JPO web–site.*
English Translation of JP 2000–212285, Kobayashi et al, Aug. 2000, from JPO web–site.*
English Translation of JP 2001–343631, Katsuragawa, Dec. 2001, from JPO web–site.*
N. Auner et al, "Chemistry of Hydrogen–Octasilsesquioxane . . . " Chem. Mater., vol. 12, pp. 3402–3418.
Kobayashi et al, "Synthesis of Highly Heat–Resistant Soluble . . . " Chemistry Letters, 1998, pp. 763,764.
Patent Abstracts of Japan, vol. 1998, No. 3, Feb. 27, 1998 & JP 09 296044.
Patent Abstracts of Japan, vol. 1998, No. 3, Feb. 27, 1998 & JP 09 296043.

* cited by examiner

*Primary Examiner*—Jeffrey B. Robertson
(74) *Attorney, Agent, or Firm*—Lorusso, Loud & Kelly

(57) ABSTRACT

A film obtained by heating a coating of a resin composition at a temperature lower than 300° C. but not lower than 40° C. in air or in an inert atmosphere. The resin composition includes a hydrosilylated polymer obtained by reacting at least one hydridosilsesquioxane compound of the following formula (1):

$$(HSiO_{3/2})_n \qquad (1)$$

wherein n is an integer of 4–1000, with at least one compound of the following formula (2)

$$R^1-C\equiv C-R^2 \qquad (2)$$

wherein $R^1$ represents a hydrogen atom, a monovalent organic group or a monovalent organosilicon group and $R^2$ represents a hydrogen atom or a group of the formula:

$$-(R')_q-C\equiv C-R$$

where R' represents a divalent organic group or a divalent organometallic group, R represents a monovalent organic group or a monovalent organosilicon group and q is 0 or 1 with the proviso that when $R^1$ is a hydrogen atom $R^2$ is a hydrogen atom.

9 Claims, 4 Drawing Sheets

FILM OBTAINED FROM SILSESQUIOXANE POLYMER AND METHOD OF PREPARING SAME

BACKGROUND OF THE INVENTION

This invention relates to a film obtained from a heat resisting silsesquioxane polymer and a cured film thereof. The present invention is also directed to a method of preparing the film. The present invention is further directed to a composite material having the above film or cured film.

The present inventors disclose in Japanese patents Nos. 2,884,073, 2884074 and 3,020,164 a hydrosilylated polymer obtained by reacting octakis(hydridosilsesquioxane), namely pentacyclo-[$9.5.1.1^{3,9}.1^{5,15}.1^{7,13}$]-ocatasiloxane, which is one of a cage-type hydridosilsesquioxanes, with a monoyne or diyne compound. In the hydrosilylated polymer, part of the hydrogen atoms bonded to the silicon atoms thereof may be substituted by an alkyl group or an aralkyl group. This polymer, which is soluble in organic solvents, is highly thermally stable. Japanese patent No. 2,884,073 also disclose the formation of a film by applying an organic solution of the hydrosilylated polymer to a glass substrate. The coating is dried at room temperature in a nitrogen gas flow and then in vacuum. The resulting film, however, has been found to form cracks and is relatively easily delaminated from the substrate.

SUMMARY OF THE INVENTION

It is, therefore, an object of the present invention to provide a film of a hydrosilylated polymer which is free of defects such as cracks and which can be tightly adhered to a substrate.

Another object of the present invention is to provide a film of the above-mentioned type which does not absorb moisture and which has high water resistance, high resistance to chemicals, good weatherability, good electric insulation properties and high mechanical strengths.

In accordance with one aspect of the present invention, there is provided a film obtained by heating a coating of a resin composition at a temperature lower than 300° C. but not lower than 40° C. in air or in an inert atmosphere, said resin composition comprising a hydrosilylated polymer obtained by reacting at least one hydridosilsesquioxane compound of the following formula (1):

$$(HSiO_{3/2})_n \qquad (1)$$

wherein n is an integer of 4–1000, with at least one compound of the following formula (2)

$$R^1-C\equiv C-R^2 \qquad (2)$$

wherein $R^1$ represents a hydrogen atom, a monovalent organic group or a monovalent organosilicon group and $R^2$ represents a hydrogen atom or a group of the formula:

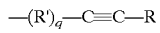

$$-(R')_q-C\equiv C-R$$

where R' represents a divalent organic group or a divalent organometallic group, R represents a monovalent organic group or a monovalent organosilicon group and q is 0 or 1 with the proviso that when $R^1$ is a hydrogen atom $R^2$ is a hydrogen atom.

In another aspect, the present invention provides a method of preparing a film, comprising applying a coating of a composition to a substrate, and heating said coating at a temperature lower than 300° C. but not lower than 40° C. in air or in an inert atmosphere for a period of time sufficient to form a film on said substrate, said composition comprising a hydrosilylated polymer obtained by reacting at least one hydridosilsesquioxane compound of the following formula (1):

$$(HSiO_{3/2})_n \qquad (1)$$

wherein n is an integer of 4–1000, with at least one compound of the following formula (2)

$$R^1-C\equiv C-R^2 \qquad (2)$$

wherein $R^1$ represents a hydrogen atom, a monovalent organic group or a monovalent organosilicon group and $R^2$ represents a hydrogen atom or a group of the formula:

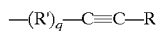

$$-(R')_q-C\equiv C-R$$

where R' represents a divalent organic group or a divalent organometallic group, R represents a monovalent organic group or a monovalent organosilicon group and q is 0 or 1 with the proviso that when $R^1$ is a hydrogen atom $R^2$ is a hydrogen atom.

The present invention also provides a cured film obtained by heating the above film at a temperature of 300–1500° C. in an inert atmosphere.

The present invention further provides a method of preparing a cured film, comprising heating the above film at a temperature of 300–1500° C. in an inert atmosphere for a period of at least 1 minute.

The present invention further provides a composite material comprising a substrate, and the above film or cured film provided on said substrate.

The present invention further provides a semiconductor device having the above film or cured film.

The above film or cured film according to the present invention is suitably used for various applications such as a protecting film (e.g. a passivation film of a semiconductor), a barrier coat film, a resist film, an insulation film (e.g. an interlayer insulation film of a semiconductor) and a heat resisting film.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
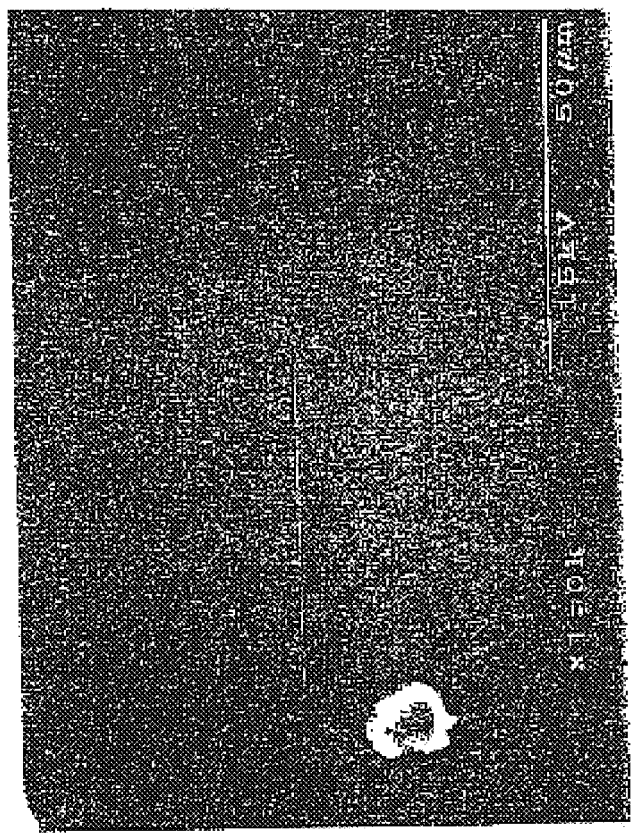
FIG. 1 is a scanning electron microphotograph (SEM) of a film obtained in Example 2 at magnification of ×1000.

The film of the present invention is obtained from a hydrosilylated polymer obtained by reacting at least one hydridosilsesquioxane compound of the following formula (1):

$$(HSiO_{3/2})_n \qquad (1)$$

wherein n is an integer of 4–1000, with at least one compound of the following formula (2)

$$R^1-C\equiv C-R^2 \qquad (2)$$

wherein $R^1$ represents a hydrogen atom, a monovalent organic group or a monovalent organosilicon group and $R^2$ represents a hydrogen atom or a group of the formula:

$$-(R')_q-C\equiv C-R$$

where R' represents a divalent organic group or a divalent organometallic group, R represents a monovalent organic group or a monovalent organosilicon group and q is 0 or 1 with the proviso that when $R^1$ is a hydrogen atom $R^2$ is a hydrogen atom.

The compound of the above formula (2) may be a bis(substituted ethynyl) compound of the following formula (3) or a monoacetylene compound of the following formula (4):

$$R-C\equiv C-(R')_q-C\equiv C-R \qquad (3)$$
$$R^1-C\equiv C-H \qquad (4)$$

wherein R, R', $R^1$ and q are as defined above.

Part of the hydrogen atoms bonded to the silicon atoms of the hydrosilylated polymer may be substituted by an alkyl group or an aralkyl group. Substitution may be carried out after the reaction of the compound (1) with the compound (2).

The hydridosilsesquioxane compound of the above formula (1) may be, for example, octakis (hydridosilsesquioxane), decakis(hydridosilsesquioxane), dodecakis(hydridosilsesquioxane) or a hydridosilsesquioxane oligomer. Octakis(hydridosilsesquioxane) is preferably used for the purpose of the present invention. These hydridosilsesquioxane compounds may be used singly or as a mixture of two or more.

In the bis(substituted ethynyl) compound represented by the formula (3), the monovalent organic or monovalent organosilicon group R may be, for example, an alkyl group such as methyl, ethyl, isopropyl, tert-butyl or hexyl, an aryl group such as phenyl, tolyl, anisyl or naphthyl, an alkoxycarbonyl group such as methoxycarbonyl or an organosilicon group such as trimethylsilyl. The alkyl may have one or more substituents such as aryl and alkoxy, while the aryl group may have one or more substituents such as alkyl and alkoxy. The alkyl and aryl groups of R may have other substituents which are inert to the hydrosilylation reaction of the compounds of the formulas (1) and (3).

In the formula (3), the divalent organic group and the divalent organometallic group R' may be, for example, an arylene group such as phenylene, naphthylene or biphenylene, a divalent heterocyclic group such as pyridylene or thienylene, an alkylene group such as methylene, ethylene or 2,2'-propylene, a silylene group such as dimethylsilylene or diphenylsilylene, a divalent siloxane group such as tetramethyldisiloxane, a carbosilane group such as phenylenebis(dimethylsilylene) or a divalent organometallic group such as ferrocenylene. These group may have one or more substituents. The alkylene and arylene groups may contain one or more ether linkages. For example, R' may be an ether-containing arylene or alkylene group such as $-CH_2-O-CH_2-$ or $-C_6H_4-O-C_6H_4-$. Each of the above arylene, alkylene, heterocyclic group, diloxane group, carbosilane group and organometallic groups may have one or more substituents such as alkyl, aryl and alkoxy groups. When q is zero, R' represents a direct bond.

In the formula (4), $R^1$ is a hydrogen atom or a monovalent organic or organosilicon group which may be the same as those exemplified above with regard to the group R. Thus, the group $R^1$ may be, for example, an alkyl group such as methyl, ethyl, isopropyl, tert-butyl or hexyl, an aryl group such as phenyl, tolyl, anisyl or naphthyl, an alkoxycarbonyl group such as methoxycarbonyl or an organosilicon group such as trimethylsilyl.

The reaction of the hydridosilsesquioxane compound of the above formula (1) with the monoyne or diyne compound of the above formula (2) may be generally carried out in the presence of a customarily employed catalyst such as a platinum-containing catalyst. Specific examples of the platinum-containing catalyst include platinum divinyltetramethyldisiloxane, platinum cyclic vinylmethylsiloxane, tris(dibenzylideneacetone)diplatinum, chloroplatinic acid, bis(ethylene)tetrachlorodiplatinum, cyclooctadienedichloroplatinum, bis(cyclooctadiene) platinum, bis(dimethylphenylphosphine)dichloroplatinum, tetrakis(triphenylphosphite)platinum and platinum carbon. The hydrosilylation may be carried out using a solvent such as toluene, benzene, hexane or an ether. The reaction temperature is not specifically limited and generally in the range from 0° C. to the boiling point of the solvent. The molar ratio of the hydridosilsesquioxane compound of the above formula (1) to the monoyne or diyne compound of the above formula (2) is generally 2:1 to 1:4.

The hydrosilylated polymer obtained by the reaction of the hydridosilsesquioxane compound of the above formula (1) with the monoyne or diyne compound of the above formula (2) preferably has a weight average molecular weight (Mw) of 2,000–500,000 and a number average molecular weight (Mn) of 2,000–500,000.

For the preparation of a film according to the present invention, the hydrosilylated polymer is dissolved in an organic solvent to form a coating solution. Any organic solvent may be used as long as it can dissolve the hydrosilylated polymer. Illustrative of suitable solvents are tetrahydrofuran, toluene, chlorobenzene, methyl ethyl ketone and hexamethyldisiloxane. If desired, the coating solution may contain one or more other polymers such as thermosetting resins and one or more additives such as colorants and fillers.

The coating solution is applied to a substrate to form a coating. The application of the coating solution may be carried out by any conventionally employed method such as casting, spin coating or bar coating in the atmosphere of an inert gas or in air. The substrate may be any self-supporting material and may have any desired shape and configuration. Thus, the substrate may be made of, for example, wood, plastic, metal, ceramic or other inorganic or organic materials and may be in the form of, for example, a sheet, a plate, a bar, a tube, a sphere, a fiber or a block. Specific examples of the substrate include glass plates, silicon wafers, molded bodies of plastics, ceramic bodies and metal bodies.

The thus obtained coating is then heated at a temperature lower than 300° C. but not lower than 40° C., preferably 50–200° C., in air or in an inert atmosphere to obtain a film free of cracks. The heating time is generally in the range of from 1 minute to about 10 hours, preferably from 3 minutes to 1 hour.

The coating before the heat treatment shows an IR spectrum having absorption peaks at 2200–2400 cm$^{-1}$ and at 850–930 cm$^{-1}$. The IR spectrum of the coating after the heating is such that the absorbance of the peak at 2200–2400 cm$^{-1}$ is at least 80% of the absorbance of the peak at 2200–2400 cm$^{-1}$ of the coating before the heating and that the absorbance of the peak at 850–930 cm$^{-1}$ is at least 80% of the absorbance of the peak at 850–930 cm$^{-1}$ of the coating before the heating.

The film may be further heat treated at a temperature of 300–1500° C. in an inert atmosphere. By such a heat treatment, Si—H groups and C≡C bonds of the hydrosilylated polymer undergo thermal hydrosilylation so that the film is cured. The cured film thus obtained has improved mechanical strengths such as hardness. The heat treatment is preferably performed at 300–1000° C. for at least 1 minute.

The cured film obtained by the heat treatment shows IR spectrum different from the film prior to the heat treatment. A cured film obtained at a relatively low temperature of about 400° C. or less shows an IR spectrum having absorption peaks at 2200–2400 cm$^{-1}$ and 850–930 cm$^{-1}$ similar to the non-treated film. However, the absorbance of each of the peaks at 2200–2400 cm$^{-1}$ and at 850–930 cm$^{-1}$ of the cured film obtained by heat treatment at a temperature higher than 400° C. is not greater than 70% of the absorbance of the similar peak of the non-treated film. These peaks gradually decrease as the curing proceeds and disappear when the curing proceeds in a high degree.

With a decrease of the peaks at 2200–2400 cm$^{-1}$ and 850–930 cm$^{-1}$, new peaks or shoulders begin appearing at 1000–1100 cm$^{-1}$ and at 1150–1240 cm$^{-1}$ in addition to the peak at 1100–1150 cm$^{-1}$.

The non-cured and cured film according to the present invention does not absorb moisture and has high water resistance, high heat resistance, high resistance to chemicals, good weatherability, good electric insulation properties, high abrasion resistance and high mechanical strengths.

The following examples will further illustrate the present invention.

EXAMPLES 1–4

Pentacyclo[9.5.1.1$^{3,9}$.1$^{5,15}$.1$^{7,13}$]ocatasiloxane ((HSiO$_{3/2}$)$_8$) was reacted with equimolar amount of 1,3-bis(phenylethynyl)benzene in toluene in the presence of platinum divinyltetramethyldisiloxane to obtain a hydrosilylated polymer (Polymer (I)). 0.2 Gram of Polymer (I) was dissolved in 2 ml of tetrahydrofuran by sonication to obtain a resin solution. The resin solution was applied by spin coating to a glass substrate (Micro Slide Glass S911 manufactured by Matsunami Inc.) at a rotational speed shown in Table 1 through 30 seconds and the coating was heated at 110° C. for 10 minutes to form, on the glass substrate, a film having a thickness shown in Table 1.

TABLE 1

| Example No. | Rotational Speed (rpm) | Thickness (μm) |
| --- | --- | --- |
| 1 | 500 | 1.0 |
| 2 | 700 | 1.0 |
| 3 | 1000 | 0.6 |
| 4 | 2000 | 0.5 |

Scanning electron microphotograph (SEM) of the film of Example 2 is shown in FIG. 1, from which it will be appreciated that the film has a smooth surface and is free of cracks.

The film of Example 2 was tested for adhesion, pencil hardness and weight loss as follows.

1. Adhesion Test:

The test was performed in accordance with Japanese Industrial Standards JIS K 5400 (checkers test method). The evaluation score was found to be 8, indicating that only slight delamination occurred at rear ends of cut portions (broken area: within 5% of the total area) but that no squares were delaminated.

2. Pencil Hardness Test:

The test was performed in accordance with Japanese Industrial Standards JIS K 5400 (pencil hardness test method by manual writing). The pencil hardness was found to be 3H.

3. Weight Loss Test:

The film-bearing glass substrate was placed in a vessel containing water for 2 hours while maintaining the inside of the vessel at the saturated aqueous vapor. A change of the weight of the film was measured after 1 hour and after 2 hours from the start of the test. Neither change of weight nor delamination or formation of cracks were detected. The above test was repeated in the same manner as described except that the vessel was placed in an oven so that the test was performed at 80° C. Neither change of weight nor delamination or formation of cracks were detected even such severe conditions.

EXAMPLE 5

Figure 2:
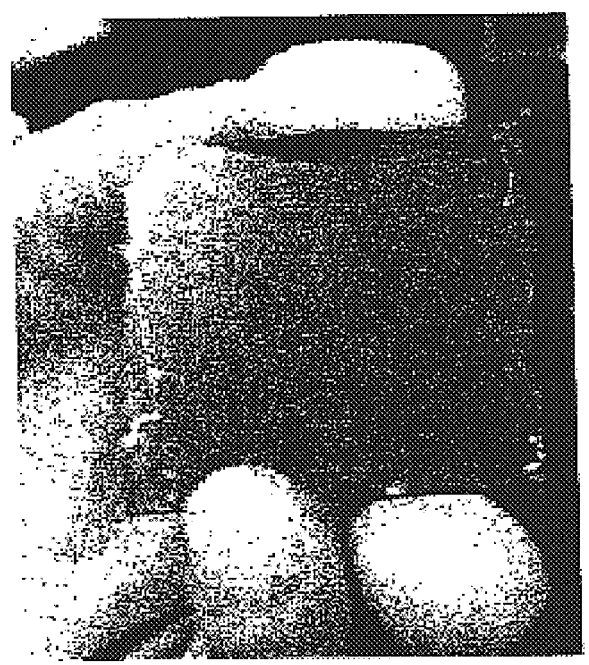
FIG. 2 is a photograph of a film formed on a silicon substrate obtained in Example 5.
Figure 3A:
FIGS. 3(a) through 3(e) are enlarged photographs of heat treated films obtained under various heating conditions in Example 5 and Examples 7–10, respectively.
Figure 3B:
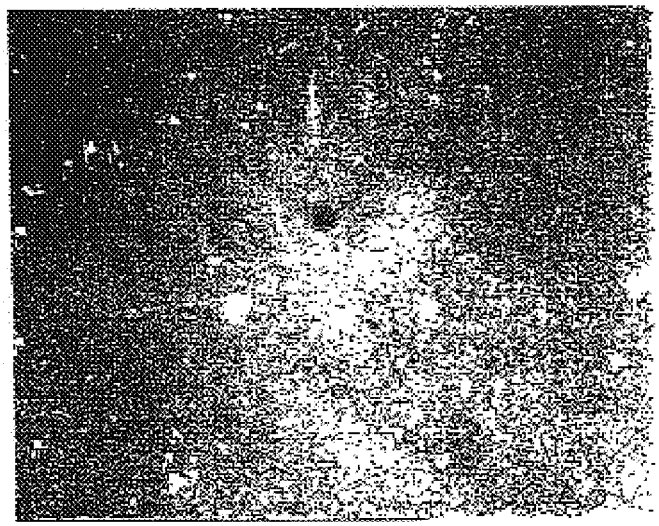
Figure 3C:
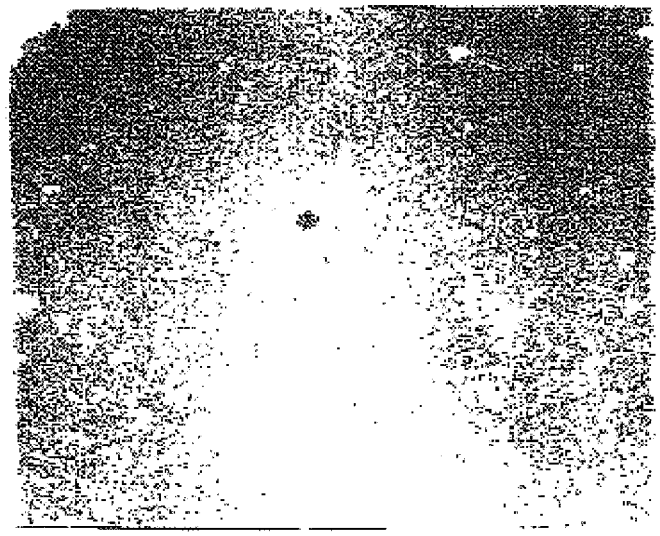
Figure 3D:
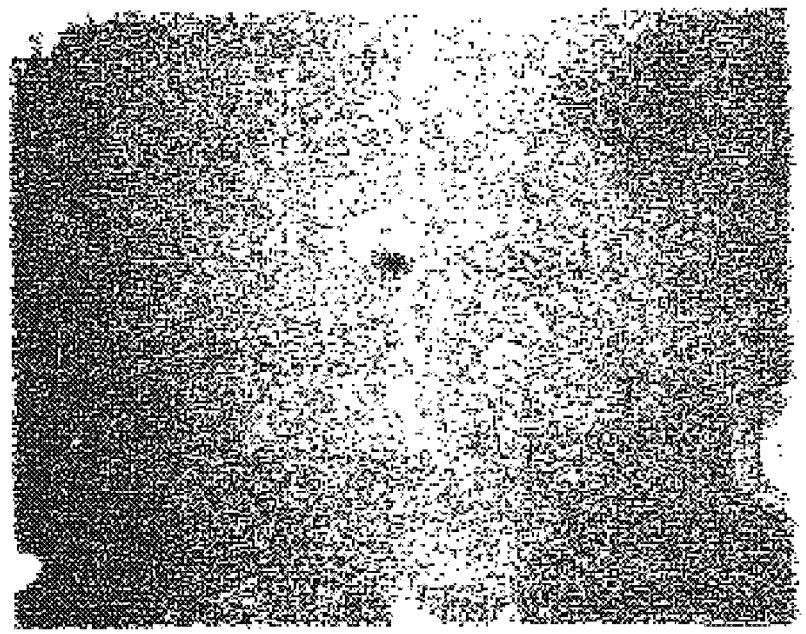
Figure 3E:
Figure 4:
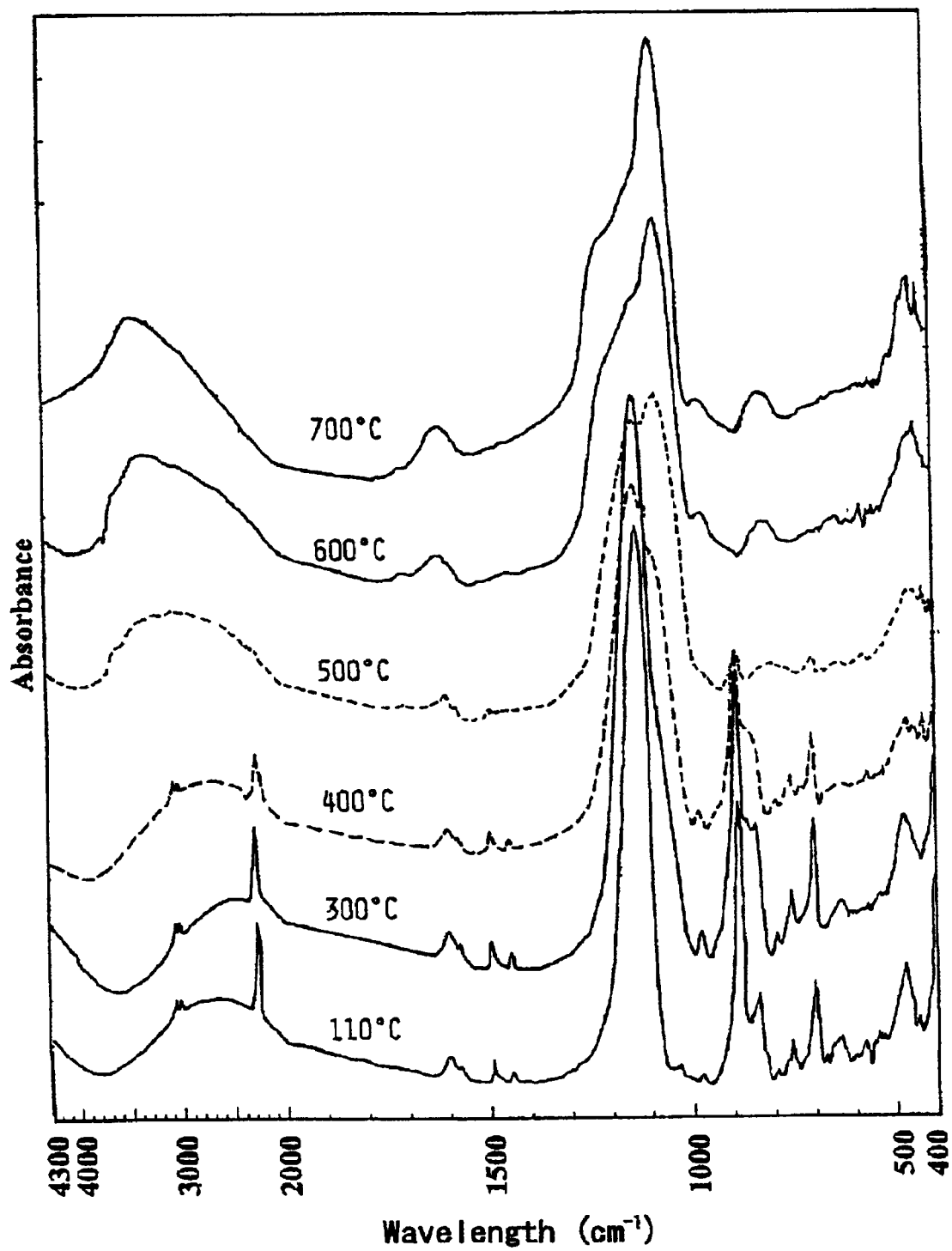
FIG. 4 shows IR spectra of films obtained in Examples 5 and 11–15.

The film forming procedure of Example 2 was repeated in the same manner as described except that a silicon substrate was substituted for the glass substrate. A photograph of the film of Example 5 is shown in FIG. 2. The film was also measured for Fourier transform infrared (FTIR) to give the results shown in Table 5 and in FIG. 4.

EXAMPLE 6

The resin solution of Polymer (I) prepared in Examples 1–4 was applied by bar coating to a glass substrate (Micro Slide Glass S911 manufactured by Matsunami Inc.) and the coating was heated at 110° C. for 10 minutes to form, on the glass substrate, a film having a thickness 3 μm. The film had no cracks.

COMPARATIVE EXAMPLE 1

Example 5 was repeated in the same manner as described except that the 10 minutes heating of the coating at 110° C. was not carried out. Rather, the applied coating was allowed to stand in air at room temperature. The dried coating was found to have a number of cracks.

COMPARATIVE EXAMPLE 2

Example 5 was repeated in the same manner as described except that the 10 minutes heating of the coating at 110° C. was not carried out. Rather, the applied coating was allowed to stand in the atmosphere of tetrahydrofuran at room temperature. The dried coating was found to have cracks.

EXAMPLES 7–10

Films obtained in the same manner as described in Example 5 were heat treated in the atmosphere of nitrogen at a temperature and for a period of time shown in Table 2 to obtain cured films. The appearance of each of the cured films thus obtained is also shown in Table 2. Photographs of the film of Example 5 and the cured films of Examples 7–10 are shown in FIGS. 3(a)–3(e), respectively. The cured films of Examples 7–9 were tested for the pencil hardness in the same manner as described previously. The results are shown in Table 2. The heat treatment was able to improve hardness of films up to 8H.

TABLE 2

| Example No. | Heating Temperature (° C.) | Heating Time (min) | Appearance of Cured Film | Pencil Hardness |
|---|---|---|---|---|
| 7 | 600 | 30 | yellow, no cracks | 8H |
| 8 | 800 | 30 | black, no cracks | 5H |
| 9 | 1000 | 30 | black, no cracks | 6H |
| 10 | 1000 | 180 | black, no cracks | — |

COMPARATIVE EXAMPLES 3–6

A solution of silicone resin (GE Toshiba Silicones SCH200) was applied to a silicon substrate by spin coating and the resulting coating was heated at 110° C. for 10 minutes to form a film having a thickness of 1.0 μm. The film was heat treated in the same manner as that in Examples 7–10. The results are summarized in Table 3. The cured film of Comparative Example 3 was 4H.

TABLE 3

| Example No. | Heating Temperature (° C.) | Heating Time (minutes) | Appearance of Cured Film |
|---|---|---|---|
| Comp. 3 | 600 | 30 | fine cracks formed |
| Comp. 4 | 800 | 30 | cracks formed |
| Comp. 5 | 1000 | 30 | cracks formed |
| Comp. 6 | 1000 | 180 | cracks formed |

COMPARATIVE EXAMPLES 7–10

Examples 3–6 were repeated in the same manner as described except that a polyimide resin (Toray semikofine SP-811) was substituted for the silicone resin. The results are summarized in Table 4.

TABLE 4

| Example No. | Heating Temperature (° C.) | Heating Time (minutes) | Appearance of Cured Film |
|---|---|---|---|
| Comp. 7 | 600 | 30 | delamination occurred |
| Comp. 8 | 800 | 30 | disappeared |
| Comp. 9 | 1000 | 30 | disappeared |
| Comp. 10 | 1000 | 180 | disappeared |

EXAMPLES 11–15

Films obtained in the same manner as described in Example 5 were heat treated in the atmosphere of nitrogen at various temperatures as shown in Table 5 for a period of 30 minutes to obtain cured films. Each of the cured films was measured for Fourier transform infrared (FTIR) to give the results shown in Table 5 and in FIG. 4 together with the results of the uncured film of Example 5.

TABLE 5

| Example No. | Heating Temperature (° C.) | vSiH (cm$^{-1}$) | vSiO (cm$^{-1}$) | | |
|---|---|---|---|---|---|
| 5 | untreated | 2272 | | 1122 | |
| 11 | 300 | 2268 | | 1122 | |
| 12 | 400 | 2260 | | 1127 | 1070 sh |
| 13 | 500 | none | 1200 sh | 1127 | 1071 |

TABLE 5-continued

| Example No. | Heating Temperature (° C.) | vSiH (cm$^{-1}$) | vSiO (cm$^{-1}$) | | |
|---|---|---|---|---|---|
| 14 | 600 | none | 1200 sh | 1130 | 1066 |
| 15 | 700 | none | 1200 sh | 1130 | 1070 |

Heat treatment at a temperature up to 300° C. did not cause any substantial change in IR spectrum and a peak was present at 1120–1130 cm$^{-1}$. At a temperature higher than about 400° C., a shoulder appeared at about 1200 cm$^{-1}$ and a new peak appeared at a wave number in the range of 1065–1075 cm$^{-1}$, indicating that a chemical change occurred as a result of the heat treatment.

EXAMPLE 16

The film forming procedure of Example 2 was repeated in the same manner as described except that a metal substrate was substituted for the glass substrate. The film was found to have a dielectric constant of 2.4–2.6 at a frequency range of 1–100 MHz.

EXAMPLE 17

The film prepared as Example 16 was further heated at 250° C. for 30 minutes. The heat-treated film was found to have a dielectric constant of 2.0–2.6 at a frequency range of 2–30 MHz.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

The teachings of Japanese Patent Application No. 2001-091233, filed Mar. 27, 2001, inclusive of the specification, claims and drawings, are hereby incorporated by reference herein.

What is claimed is:

1. A cured film obtained by curing a precursor film at a temperature of 300–1500° C. in an inert atmosphere, said precursor film being obtained by heating a coating of a resin composition at a temperature lower than 300° C. but not lower than 40° C. in air or in an inert atmosphere, said resin composition comprising a hydrosilylated polymer obtained by reacting at least one hydridosilsesquioxane compound of the following formula (1):

$$(HSiO_{3/2})_n \qquad (1)$$

wherein n is an integer of 4–1000, with at least one compound of the following formula (2)

$$R^1—C\equiv C—R^2 \qquad (2)$$

wherein $R^1$ represents a hydrogen atom, a monovalent organic group or a monovalent organosilicon group and $R^2$ represents a hydrogen atom or a group of the formula:

$$—(R')_q—C\equiv C—R$$

where R' represents a divalent organic group or a divalent organometallic group, R represents a monovalent organic group or a monovalent organosilicon group and q is 0 or 1 with the proviso that when $R^1$ is a hydrogen atom $R^2$ is a hydrogen atom, said cured film showing an IR spectrum having absorption peaks at 2200–2400 cm$^{-1}$ and 850–930 cm$^{-1}$, wherein the absorbance of the peak at 2200–2400 cm$^{-1}$ of the coating after said curing is not greater than 70% of the absorbance of the peak at 2200–2400 cm$^{-1}$ of the coating before said curing, and wherein the absorbance of the peak at 850–930 cm$^{-1}$ of the coating after said curing is not greater than 70% of the absorbance of the peak at 850–930 cm$^{-1}$ of the coating before said curing.

2. A cured film as claimed in claim 1, wherein part of the hydrogen atoms bonded to the silicon atoms of said hydrosilylated polymer is substituted by an alkyl group or an aralkyl group.

3. A cured film as claimed in claim 1, wherein n in the formula (1) of said hydridosilsesquioxane is 8.

4. A cured film as claimed in claim 1, wherein IR spectra of said coating before and after said heating show absorption peaks at 2200–2400 cm$^{-1}$ and at 850–930 cm$^{-1}$, wherein the absorbance of the peak at 2200–2400 cm$^{-1}$ of the coating after said heating is at least 80% of the absorbance of the peak at 2200–2400 cm$^{-1}$ of the coating before said heating, and wherein the absorbance of the peak at 850–930 cm$^{-1}$ of the coating after said heating is at least 80% of the absorbance of the peak at 850–930 cm$^{-1}$ of the coating before said heating.

5. A cured film as claimed in claim 1, and showing an IR spectrum having an absorption peak at 1100–1150 cm$^{-1}$ and at least one additional absorption at 1000–1100 cm$^{-1}$ and at 1150–1240 cm$^{-1}$, said additional absorption is in the form of a peak or a shoulder.

6. A composite material comprising a substrate, and a cured film according to claim 1 provided on said substrate.

7. A semiconductor device having a cured film according to claim 1.

8. A semiconductor device according to claim 7, wherein said cured film is selected from a surface coat film, a barrier coat film, a passivation film and an interlayer insulation film.

9. A method of preparing a cured film, comprising applying a coating of a composition to a substrate, heating said coating at a temperature lower than 300° C. but not lower than 40° C. in air or in an inert atmosphere for a period of time sufficient to form a precursor film on said substrate, and curing said precursor film at a temperature of 300–1500° C. in an inert atmosphere, said composition comprising a hydrosilylated polymer obtained by reacting at least one hydridosilsesquioxane compound of the following formula (1):

$$(HSiO_{3/2})_n \quad (1)$$

wherein n is an integer of 4–1000, with at least one compound of the following formula (2)

$$R^1\!-\!C\!\equiv\!C\!-\!R^2 \quad (2)$$

wherein $R^1$ represents a hydrogen atom, a monovalent organic group or a monovalent organosilicon group and $R^2$ represents a hydrogen atom or a group of the formula:

$$-(R')_q\!-\!C\!\equiv\!C\!-\!R$$

where R' represents a divalent organic group or a divalent organometallic group, R represents a monovalent organic group or a monovalent organosilicon group and q is 0 or 1 with the proviso that when $R^1$ is a hydrogen atom $R^2$ a hydrogen atom, so that said cured film shows an IR spectrum having absorption peaks at 2200–2400 cm$^{-1}$ and 850–930 cm$^{-1}$, wherein the absorbance of the peak at 2200–2400 cm$^{-1}$ of the coating after said curing is not greater than 70% of the absorbance of the peak at 2200–2400 cm$^{-1}$ of the coating before said curing, and wherein the absorbance of the peak at 850–930 cm$^{-1}$ of the coating after said curing is not greater than 70% of the absorbance of the peak at 850–930 cm$^{-1}$ of the coating before said curing.

* * * * *